United States Patent
Yang et al.

(10) Patent No.: US 7,323,919 B2
(45) Date of Patent: Jan. 29, 2008

(54) PULSE-WIDTH MODULATION CIRCUITS OF SELF-OSCILLATION TYPE AND PULSE-WIDTH MODULATION METHODS

(75) Inventors: Chung-Gil Yang, Gunpo-si (KR); Jong-Haeng Lee, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 30 days.

(21) Appl. No.: 11/357,495

(22) Filed: Feb. 17, 2006

(65) Prior Publication Data
US 2006/0197570 A1   Sep. 7, 2006

(30) Foreign Application Priority Data
Feb. 24, 2005   (KR) .................. 10-2005-0015340

(51) Int. Cl.
*H03K 3/017* (2006.01)
(52) U.S. Cl. .................. 327/172; 330/251
(58) Field of Classification Search .................. None
See application file for complete search history.

(56) References Cited

U.S. PATENT DOCUMENTS

| | | | |
|---|---|---|---|
| 4,577,154 A * | 3/1986 | Takagi et al. .................. | 327/176 |
| 5,886,586 A * | 3/1999 | Lai et al. .................. | 332/109 |
| 5,973,368 A * | 10/1999 | Pearce et al. .................. | 257/368 |
| 6,763,114 B1 | 7/2004 | Nalbant .................. | 381/120 |
| 6,791,405 B2 * | 9/2004 | Tsuji et al. .................. | 330/10 |
| 6,795,004 B2 * | 9/2004 | Masuda et al. .................. | 341/143 |
| 6,924,700 B2 * | 8/2005 | Taura et al. .................. | 330/251 |
| 7,038,535 B2 * | 5/2006 | Lee .................. | 330/10 |
| 7,058,464 B2 * | 6/2006 | Mallinson .................. | 700/94 |
| 2003/0058038 A1 * | 3/2003 | Noro et al. .................. | 330/10 |

FOREIGN PATENT DOCUMENTS

| | | |
|---|---|---|
| JP | 2003-078363 | 3/2003 |
| JP | 2003-101357 | 4/2003 |
| JP | 2003-110375 | 4/2003 |
| JP | 2003-204590 | 7/2003 |

* cited by examiner

*Primary Examiner*—Cassandra Cox
(74) *Attorney, Agent, or Firm*—F. Chau & Assoc., LLC

(57) ABSTRACT

Pulse-width modulation (PWM) circuits and methods integrate a feedback signal and an input signal to generate an integral signal, and generate a PWM signal by switching an output node from a first source voltage to a second source voltage based upon comparing the integral signal with a first reference voltage, and switching the output node from the second source voltage to the first source voltage based upon comparing the integral signal with a second reference voltage. A comparator unit compares the integral signal with the first and second reference (threshold) voltages, and a drive circuit for buffering the comparator unit's output signals generates drive signals. A feedback circuit generates the feedback signal based on (e.g., proportional with) the PWM signal. The switching circuit may include a P-type switch (e.g., PMOS transistor) and a N-type switch (e.g., NMOS transistor). Associated class-D audio amplifiers and modulation methods are provided.

32 Claims, 7 Drawing Sheets

PULSE-WIDTH MODULATION CIRCUITS OF SELF-OSCILLATION TYPE AND PULSE-WIDTH MODULATION METHODS

CLAIM FOR PRIORITY

This application claims priority under 35 USC § 119 of Korean Patent Application No. 2005-15340, filed on Feb. 24, 2005, the contents of which are herein incorporated by reference in their entirety.

BACKGROUND OF THE INVENTION

1. Field of the Invention

The present invention generally relates to pulse-width modulation circuits and pulse-width modulation methods, and more particularly to circuits and methods related to pulse-width modulation of a self-oscillation type.

2. Description of the Related Art

A class-D amplifier is used in electronic products, such as digital versatile disc (DVD) players, because of its superior performance compared to an analog amplifier. Pulse-width modulation (PWM) has become the core of class-D amplifiers.

Conventional PWM circuits generate a pulse of a certain width by comparing an audio signal with a triangular wave or a sawtooth wave, and so the conventional class-D amplifier requires a ramp signal generator to modulate a pulse's width. The ramp signal generator generates a ramp signal between 200 kHz to 500 kHz, and if the ramp signal generator is incorporated into an integrated circuit, the ramp signal generator occupies a large area on the chip. Therefore, a PWM circuit that generates a PWM signal without the ramp signal generator, would reduced the area required on a chip for PWM.

FIG. 1 illustrates a class-D audio amplifier with a self-oscillation type PMW circuit as disclosed in U.S. Pat. No. 4,531,096. FIG. 2 is a timing diagram illustrating waveforms of signals at parts of the conventional class-D audio amplifier shown in FIG. 1.

Referring to FIG. 1 an integrator of the class-D audio amplifier integrates an input signal 10*a* and a feedback signal V0. The integrator includes an operational amplifier 11, capacitors 12*a* and 12*b*, and resistors 13 and 21. The feedback signal, (i.e. a PWM signal V0) output from the PWM circuit, is applied to an inverting input terminal of the operational amplifier 11 through a resistor 18 and the input signal 10*a* is applied to a non-inverting input terminal of the operational amplifier 11. Referring to FIGS. 1 & 2, an output voltage V1 of the integrator (an output of the operational amplifier 11) has a form of a triangular wave, and an output voltage V2 (output by a digital inverter 14*a*) has the form of a pulse wave. Additionally, an output signal V5 of an ON-OFF-timing control circuit 20 and an output signal V6 of a pulse amplifier 33 both have the form of a pulse wave having a dead time. The PWM signal V0 is an output signal of a switching circuit including a p-channel metal oxide semiconductor (PMOS) transistor 22*a* and an n-channel metal oxide semiconductor (NMOS) transistor 22*b*. The duty factor of the PWM signal V0 varies linearly with a voltage variation of the input signal 10*a*. The PWM signal V0 is demodulated by a low-pass filter 34, and is provided to a speaker 35. Therefore, the conventional PWM circuit of the class-D audio amplifier generates the PWM signal having a duty factor, which may be varied according to the variation of the input signal.

SUMMARY OF THE INVENTION

Some embodiments of the present invention provide a pulse-width modulation (PWM) circuit for controlling the duty factor of a pulse-width modulation signal based on a variation of an input signal without a ramp signal generator.

Various embodiments of the invention provide a pulse-width modulation (PWM) circuit comprising: an integrator configured to integrate a feedback signal and an input signal and to thereby generate an integral signal; a switching circuit configured to generate a PWM signal by switching an output node from a first source voltage to a second source voltage based upon comparing the integral signal with a first reference voltage and switching the output node from the second source voltage to the first source voltage based upon comparing the integral signal with a second reference voltage; and a feedback circuit configured to generate the feedback signal based upon the PWM signal. The PWM circuit may further comprise a comparator unit configured to compare the integral signal with the first reference voltage and to compare the integral signal with the second reference voltage. The comparator unit may include: a first comparator configured to compare the integral signal with the first reference voltage and to output a pulse signal in a first logic state when the integral signal becomes greater than the first reference voltage; and a second comparator configured to compare the integral signal with the second reference voltage and to output a pulse signal in the first logic state when the integral signal becomes smaller than the second reference voltage.

Various embodiments of the invention provide a method of modulating a pulse-width, the method comprising: generating an integral signal by integrating a feedback signal and an input signal; generating a PWM signal by switching an output node from a first source voltage to a second source voltage based upon comparing the integral signal with a first reference voltage, and switching the output node from the second source voltage to the first source voltage based upon comparing the integral signal with a second reference voltage; and generating the feedback signal in response to the PWM signal.

Various embodiments of the invention provide a class-D audio amplifier comprising: a pulse-width modulation (PWM) circuit configured to integrate an input signal and a feedback signal to generate a PWM signal (therefrom), wherein the feedback signal is based upon the PWM signal.

Embodiments of the present invention provide a PWM circuit that may occupy a relatively smaller area on a semiconductor integrated circuit (IC) chip.

Embodiments of the present invention provide a class-D audio amplifier having a PWM circuit that controls the duty factor of a pulse-width modulation signal based on a variation of an input signal without a (fixed slope) ramp signal generator.

Further embodiments of the present invention provide a pulse-width modulation method, by which the duty factor of the pulse-width modulation signal may be controlled based on a variation of an input signal without a (fixed slope) ramp signal generator.

In some embodiments of the present invention, a pulse-width modulation (PWM) circuit includes an integrator, a comparator unit, a drive circuit, a switching circuit, and a feedback circuit. The integrator integrates a feedback signal and an input signal to generate an integral signal. The comparator unit generates a first comparator output signal by comparing the integral signal with a first reference voltage and generates a second comparator output signal by comparing the integral signal with a second reference voltage. The drive circuit buffers the first comparator output signal and the second comparator output signal to generate a first drive signal and a second drive signal. The switching circuit generates a PWM signal by switching an output node between a first source voltage and a second source voltage in response to the first drive signal and the second drive signal. The feedback circuit generates the feedback signal in response to the PWM signal.

In further embodiments, the PWM circuit may further include a latch circuit, that latches the first comparator output signal and the second comparator output signal, to generate a first latch(ed) output signal corresponding to the first comparator output signal and a second latch output signal corresponding to the second comparator output signal.

In various embodiments, the first reference voltage may correspond to a top threshold voltage of the integral signal and the second reference voltage corresponds to a bottom threshold voltage of the integral signal. An absolute value of a slope of the integral signal may be increased for a falling portion of the integral signal, and the slope of the integral signal may be decreased for a rising portion of the integral signal when the input signal has a positive voltage. On the contrary, an absolute value of a slope of the integral signal may be decreased for a falling portion of the integral signal and the slope of the integral signal may be increased for a rising portion of the integral signal when the input signal has a negative voltage. The PWM signal may have a duty factor varying linearly with a variation of the input signal. The duty factor of the PWM signal corresponding to a falling portion of the integral signal is smaller than ½, and the duty factor of the PWM signal corresponding to a rising portion of the integral signal is greater than ½ when the input signal has a positive voltage. Conversely, the duty factor of the PWM signal corresponding to a falling portion of the integral signal is greater than ½, and the duty factor of the PWM signal corresponding to a rising portion of the integral signal is smaller than ½ when the input signal has a negative voltage.

In some embodiments of the present invention, a class-D audio amplifier includes a pulse-width modulation (PWM) circuit for integrating an input signal and a feedback signal to generate an integral signal, generating drive signals by comparing the integral signal with a top threshold voltage and a bottom threshold voltage, and for generating a PWM signal in response to the drive signals, wherein the feedback signal is generated based on (e.g., proportional to) the PWM signal. In addition, the class-D audio amplifier includes a low-pass filter for carrying out low-pass filtering for the PWM signal. The PWM circuit may include a PWM basic circuit for integrating the input signal and the feedback signal to generate the integral signal, generating drive signals by comparing the integral signal with the top threshold voltage and the bottom threshold voltage, and generating the PWM signal in response to the drive signals. The PWM circuit may further include a feedback circuit (e.g., including a resistor) for generating the feedback signal in response to the PWM signal.

Some embodiments of the present invention provide a method of modulating a pulse-width, including: generating an integral signal by integrating a feedback signal and an input signal, generating a first comparator output signal by comparing the integral signal with a first reference voltage, generating a second comparator output signal by comparing the integral signal with a second reference voltage, generating a first drive signal and a second drive signal drive by buffering the first comparator output signal and the second comparator output signal, generating a PWM signal by switching an output node between a first source voltage and a second source voltage in response to the first drive signal and the second drive signal, and generating the feedback signal in response to the PWM signal.

In further embodiments, the method may further include latching the first comparator output signal and the second comparator output signal to generate a first latch output signal corresponding to the first comparator output signal and a second latch output signal corresponding to the second comparator output signal.

Generating the first comparator output signal may correspond to outputting a pulse signal in a logic LOW state when the integral signal becomes greater than the first reference voltage (by comparing the integral signal with the first reference voltage). Generating the second comparator output signal may correspond to outputting a pulse signal in the logic LOW state when the integral signal becomes smaller than the second reference voltage (by comparing the integral signal with the second reference voltage). The first reference voltage may correspond to a top threshold voltage of the integral signal and the second reference voltage corresponds to a bottom threshold voltage of the integral signal.

An absolute value of a slope of the integral signal may be increased for a falling portion of the integral signal and the slope of the integral signal may be decreased for a rising portion of the integral signal when the input signal has a positive voltage. On the other hand, an absolute value of a slope of the integral signal may be decreased for a falling portion of the integral signal and the slope of the integral signal may be increased for a rising portion of the integral signal when the input signal has a negative voltage. The PWM signal may have a duty factor varying linearly with a variation of the input signal.

Specific example embodiments of the present invention will be described in greater detail with reference to the accompanying drawings. This invention may, however, be embodied in many different forms and should not be construed as limited to the embodiments set forth herein. Rather, these exemplary embodiments are provided so that this disclosure will be thorough and complete, and will fully convey the scope of the invention to those skilled in the art. In the drawings, like numbers refer to like elements. It will be understood that when an element is referred to as being "connected" or "coupled" to or driven by, or driving, another element or signal, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification and will not be interpreted in an idealized or overly formal sense unless expressly so defined herein.

It will be understood that although the terms "first" and "second" are used herein to describe various elements, to distinguish one element from another element. Thus, a first item could be termed a second item, and similarly, a second item may be termed a first item without departing from the teachings of the present invention. As used herein, the term "and/or" includes any and all combinations of one or more of the associated listed items. The symbol "/" may also used as a shorthand notation for "and/or".

BRIEF DESCRIPTION OF THE DRAWINGS

The above and other features of the present invention will become more apparent to persons skilled in the art by describing in detail the exemplary embodiments thereof with reference to the accompanying drawings, in which.

DETAILED DESCRIPTION OF THE EXEMPLARY EMBODIMENTS

Figure 1:
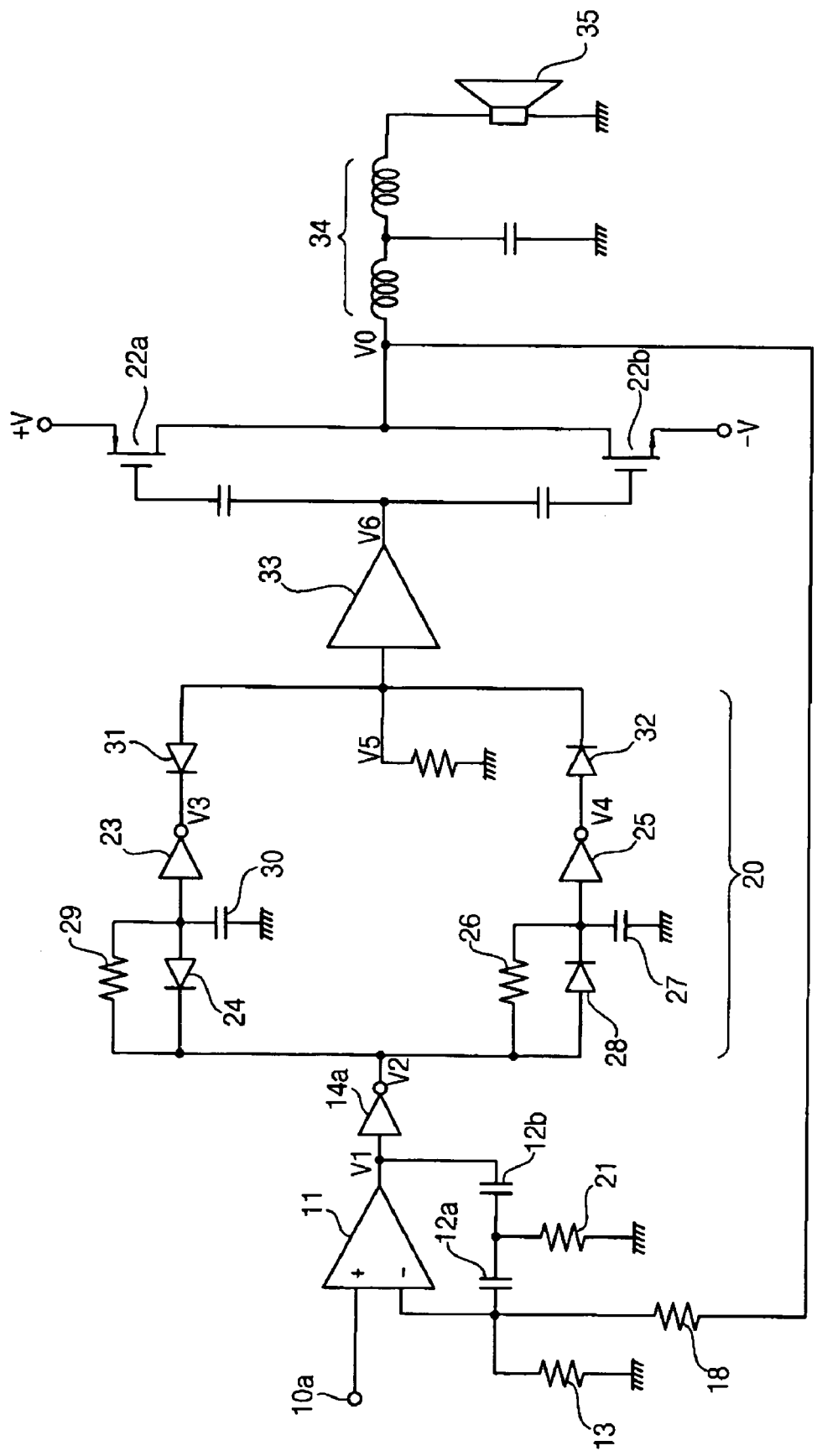
FIG. 1 is a circuit diagram of a conventional class-D audio amplifier with a pulse-width modulation (PWM) circuit.
Figure 2:
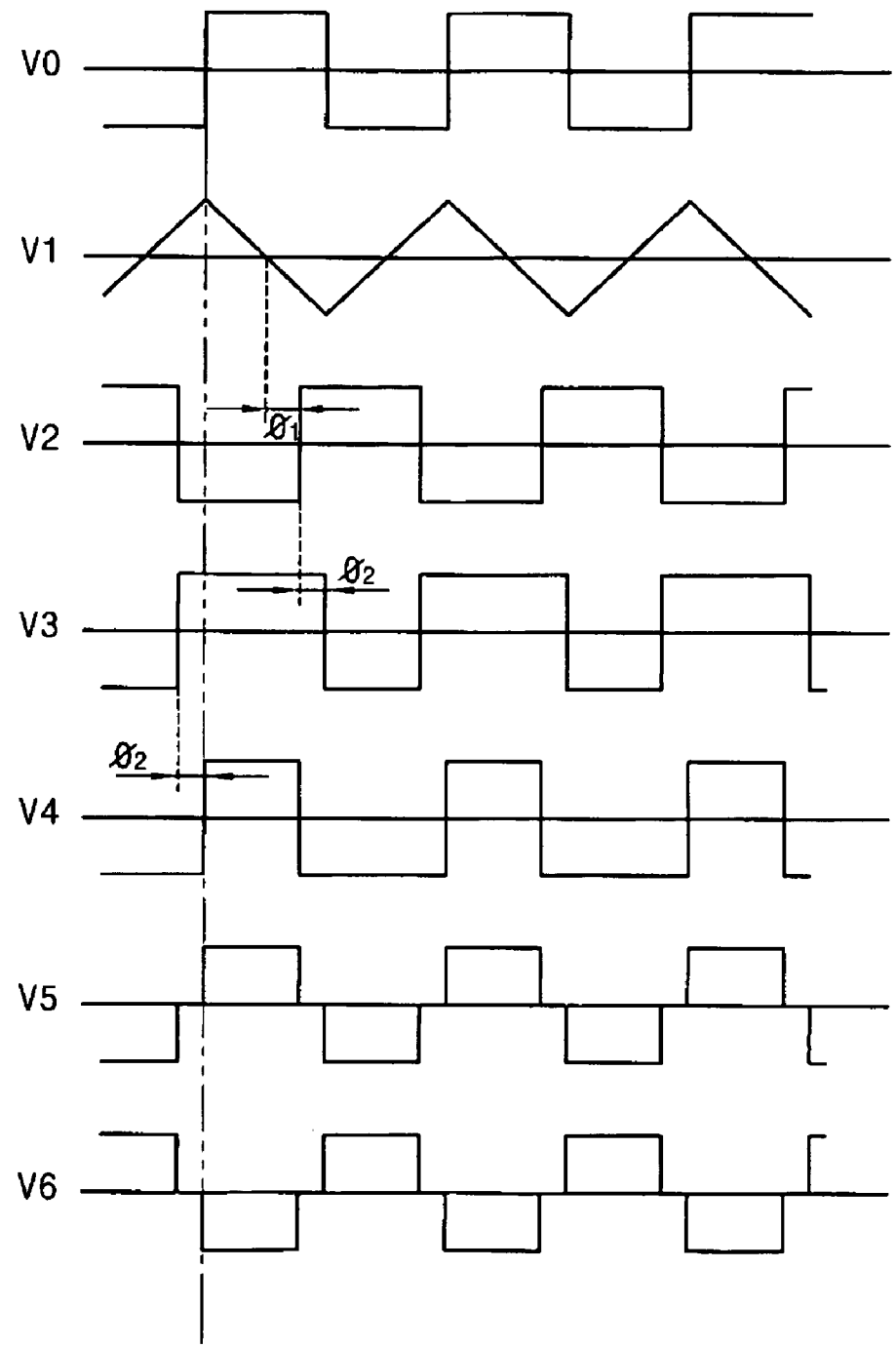
FIG. 2 is a timing diagram illustrating waveforms of parts of the conventional class-D amplifier of FIG. 1.
Figure 3:
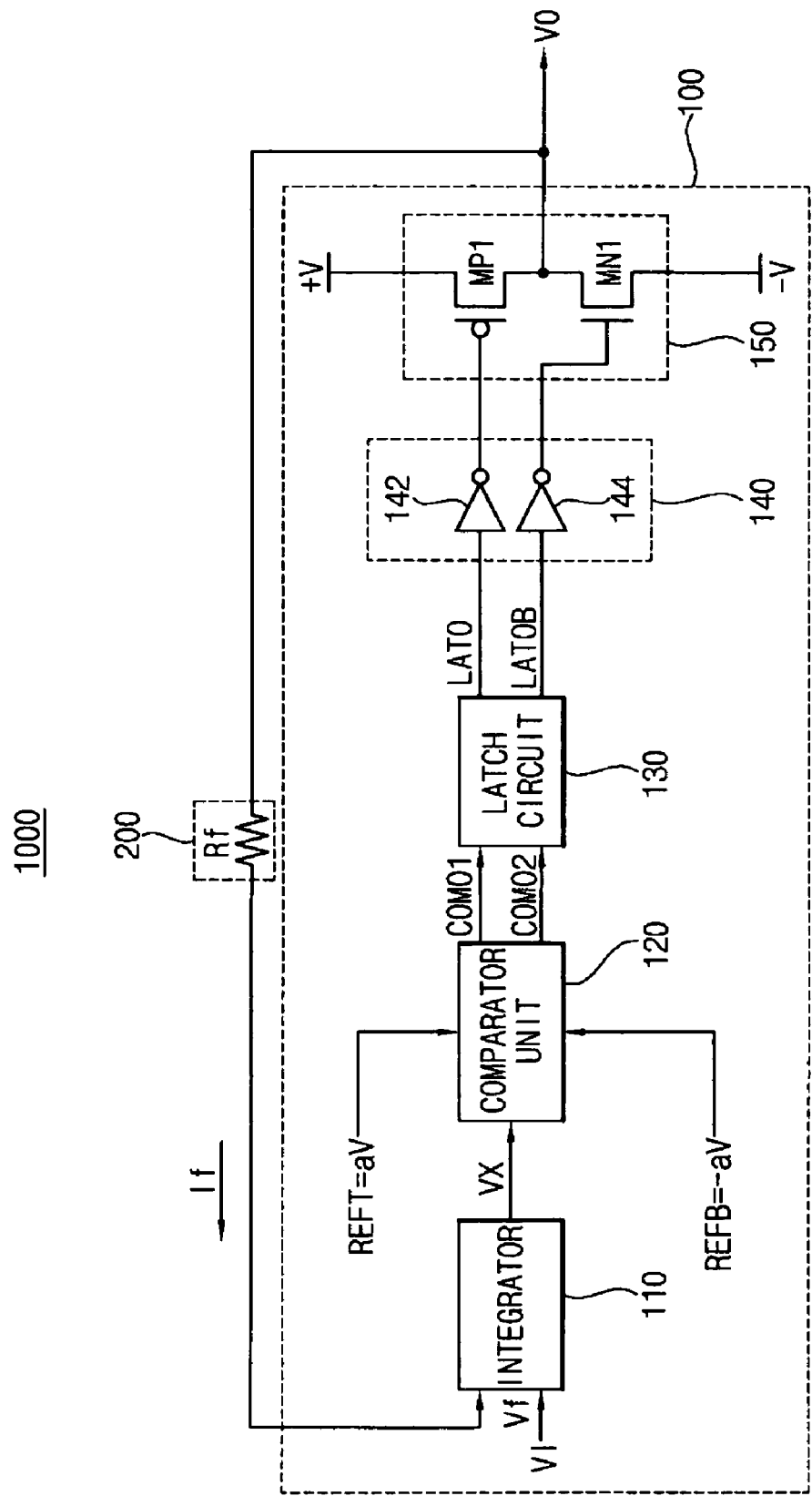
FIG. 3 is a block diagram of a PWM circuit according to some embodiments of the present invention.

FIG. 3 is a block diagram illustrating a pulse-width modulation (PWM) circuit according to an exemplary embodiment of the present invention.

Referring to FIG. 3, the PWM circuit may include a PWM basic circuit 100 and a feedback circuit 200. The PWM basic circuit 100 includes an integrator 110, a comparator unit 120, a latch circuit 130, a drive circuit 140 and a switching circuit 150. The feedback circuit 200 may be implemented as a resistor Rf. The drive circuit 140 includes inverters 142 and 144, and the switching circuit 150 may include a p-channel metal oxide semiconductor (PMOS) transistor MP1 and an n-channel metal oxide semiconductor (NMOS) transistor MN1.

The PWM basic circuit 100 generates a PWM signal V0 in response to a feedback signal Vf, an input signal VI, a first reference voltage REFT and a second reference voltage REFB. The feedback circuit generates a feedback current If in response to the PWM signal V0.

The integrator 110 integrates feedback signal Vf (associated with the feedback current If) and the input signal VI, and generates an integral signal VX. The comparator unit 120 generates a first comparator output signal COMO1 by comparing the integral signal VX with the first reference voltage REFT, and generates a second comparator output signal COMO2 by comparing the integral signal VX with the second reference voltage REFB.

The latch circuit 130 latches the first comparator output signal COMO1 and the second comparator output signal COMO2, and generates a first latched output signal LATO and a second latched output signal LATOB. The first latched output signal LATO and the second latched output signal LATOB have mutually opposite phases.

The drive circuit 140 buffers (and inverts) the first latched output signal LATO and the second latched output signal LATOB.

The switching circuit 150 switches an output node between a high source voltage +V and a low source voltage −V, and generates the PWM signal V0 with a voltage level +V or −V in response to the output signals of the drive circuit 140.

The feedback circuit 200 generates the feedback current If in response to the PWM signal V0.

In the PWM circuit of FIG. 3, the first reference voltage REFT has a value of +aV which corresponds to a voltage value proportional to the high source voltage +V of the switching circuit 150, and the second reference voltage REFB has a value of −aV which corresponds to a voltage value proportional to the low source voltage −V of the switching circuit 150, where 'a' is a proportional coefficient.

While the PWM signal V0 remains in a logic HIGH state, the feedback current If has a positive (+) value, and the feedback current flows into the integrator 110 through the feedback resistor Rf. While the PWM signal V0 remains in the logic LOW state, the feedback current If has a negative (−) value, and the feedback current flows to the output node of the PWM circuit 1000 through the feedback resistor Rf.

Figure 4:
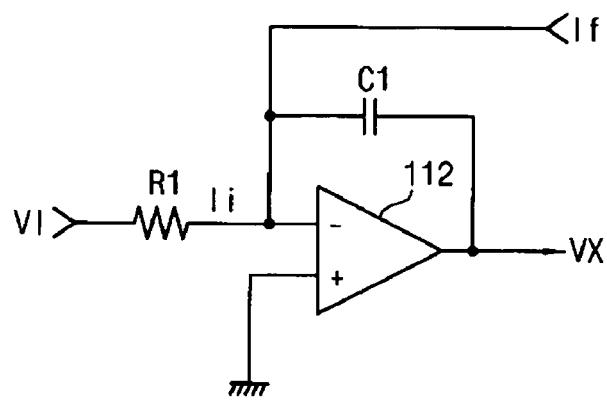
FIG. 4 is a circuit diagram of the integrator 110 of the PWM circuit of FIG. 3.

FIG. 4 is a circuit diagram illustrating the integrator of the PWM circuit 110 of FIG. 3. Referring to FIG. 4, the integrator 110 may include a resistor R1, an operational amplifier 112 and a capacitor C1.

The resistor R1 receives the input signal VI and generates the input current Ii, which is provided to an inverting input terminal of the operational amplifier 112. The operational amplifier 112 includes the inverting input terminal receiving both the feedback current If and the input current Ii corresponding to the input signal VI, a non-inverting input terminal coupled to ground, and an output terminal. The capacitor C1 is coupled (connected) between the inverting input terminal and the output terminal of the operational amplifier 112.

Hereinafter, operations of the integrator 110 shown in FIG. 4 will be explained.

Figure 7:
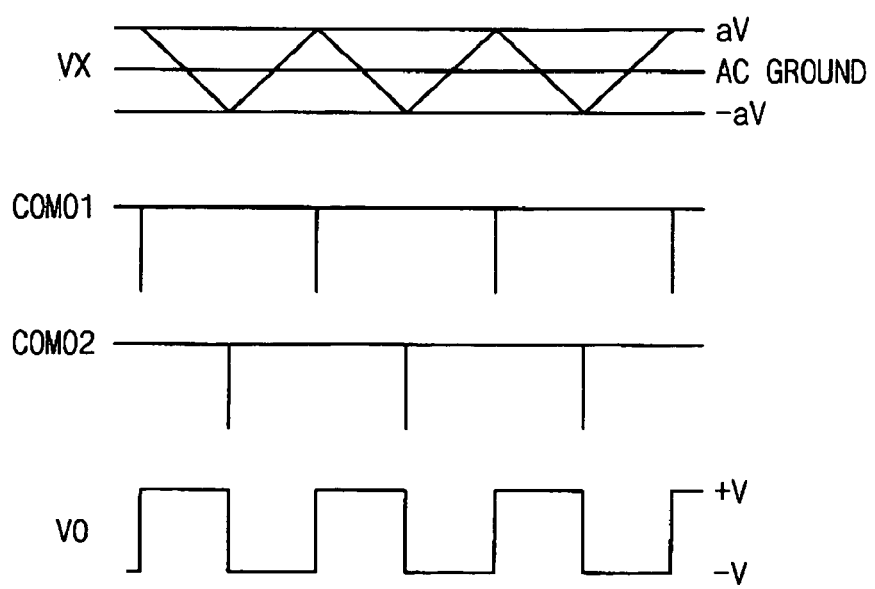
FIG. 7 is a timing diagram illustrating waveforms of signals at parts of the PWM circuit when an input signal is not applied to the PWM circuit of FIG. 3.
Figure 8:
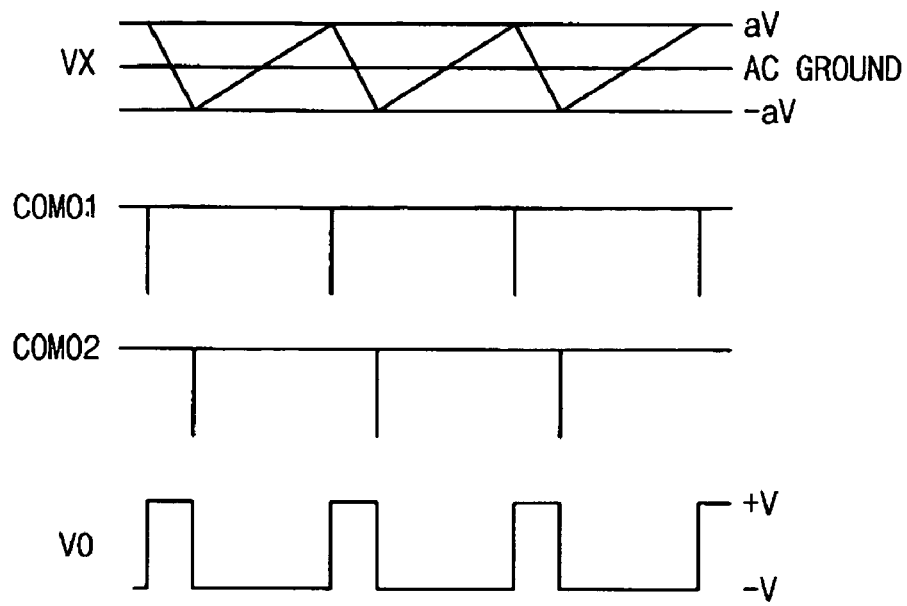
FIG. 8 is a timing diagram illustrating waveforms of signals at parts of the PWM circuit when a positive input signal is applied to the PWM circuit of FIG. 3.
Figure 9:
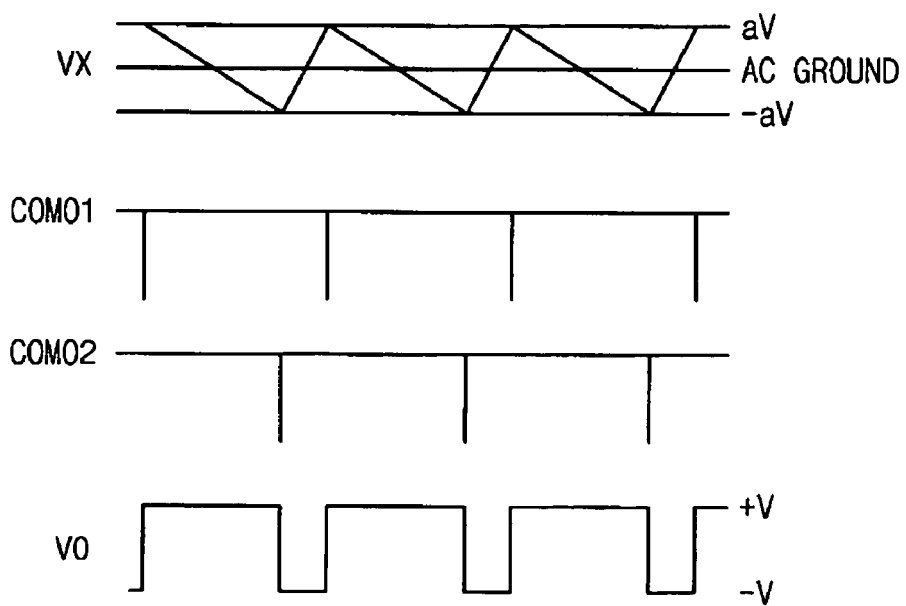
FIG. 9 is a timing diagram illustrating waveforms of signals at parts of the PWM circuit when a negative input signal is applied to the PWM circuit of FIG. 3.

When the feedback current If has a positive value, i.e. when the PWM signal V0 is in the HIGH state, the integral signal VX, corresponding to an output voltage of the operational amplifier 112, decreases linearly. On the other hand, when the feedback current If has a negative value, i.e. when the PWM signal V0 is in the LOW state, the integral signal VX, corresponding to an output voltage of the operational amplifier 112, increases linearly. As a result, the integral signal VX has a triangular waveform as shown in FIG. 7. In case of the positive input signal VI, the absolute value of the slope of the integral signal VX is increased for a falling portion of the integral signal VX//, and the slope of the integral signal VX is decreased for a rising portion of the integral signal VX as shown in FIG. 8. Conversely, in case of the negative input signal VI, the absolute value of the slope of the integral signal VX is decreased for a falling portion of the integral signal VX, and the slope of the integral signal VX is increased for a rising portion of the integral signal VX as shown in FIG. 9.

Figure 5:
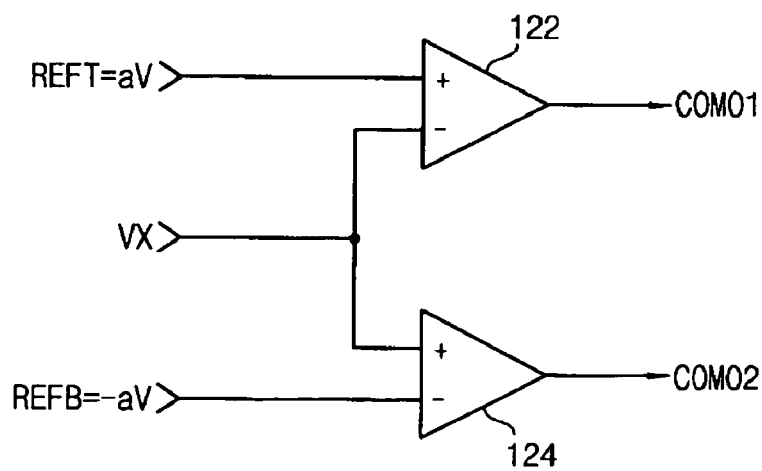
FIG. 5 is a circuit diagram of the comparator unit 120 of the PWM circuit of FIG. 3.

FIG. 5 is a circuit diagram of the comparator unit 120 of the PWM circuit of FIG. 3. Referring to FIG. 5, the comparator unit 120 includes a first comparator 122 and a second comparator 124.

By comparing the integral signal VX with the first reference voltage REFT, the first comparator 122 outputs a first comparator output signal COMO1 having a pulse waveform in a logic LOW state when the integral signal VX becomes greater than the first reference voltage REFT. Conversely, by comparing the integral signal VX with the second reference voltage REFB, the second comparator 124 outputs a second comparator output signal COMO2 having a pulse waveform in the logic LOW state when the integral signal VX becomes smaller than the second reference voltage REFB.

In other words, when the integral signal becomes greater than +aV, the first comparator outputs the first comparator output signal COMO1, a pulse signal in the LOW state; and, when the integral signal becomes smaller than −aV, the second comparator outputs the second comparator output signal COMO2, a pulse signal in the LOW state.

Figure 6:
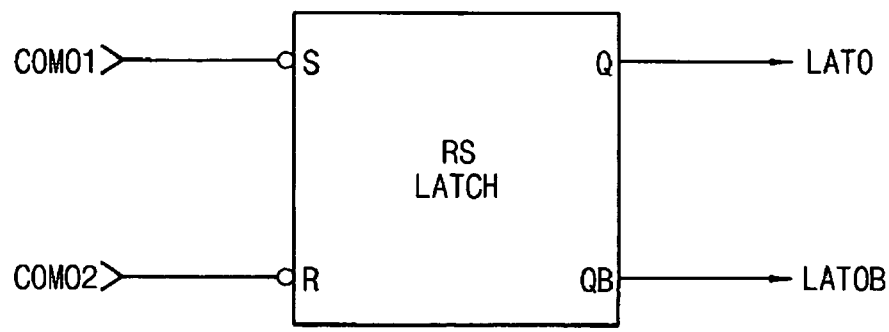
FIG. 6 is a circuit diagram of the latch circuit 130 of the PWM circuit of FIG. 3.

FIG. 6 is a circuit diagram of the latch circuit 130 of the PWM circuit of FIG. 3. As shown in FIG. 6, the latch circuit 130 may be implemented as an RS latch circuit. The RS latch circuit latches the first comparator output signal COMO1 and the second comparator output signal COMO2 to generate the first latched output signal LATO and the second latched output signal LATOB, respectively.

In the RS latch circuit of FIG. 6, the first latch output signal LATO is enabled and the second latched output signal LATOB is disabled when the first comparator output signal COMO1 is (pulsed) in the logic LOW state and the second comparator output signal COMO2 is in the logic HIGH state. Conversely, the first latch output signal LATO is disabled and the second latched output signal LATOB is enabled when the first comparator output signal COMO1 is in the logic HIGH state and the second comparator output signal COMO2 is (pulsed) in the logic LOW state. The first latched output signal LATO and the second latched output signal LATOB have phases opposite to each other.

FIG. 7 through FIG. 9 are timing diagrams illustrating waveforms of signals at parts of the PWM circuit of FIG. 3. FIG. 7 illustrates waveforms of signals at parts of the PWM circuit of FIG. 3 when an input signal is not applied to the PWM. FIG. 8 illustrates waveforms of signals at parts of the PWM circuit of FIG. 3 when a positive input signal VI is applied to the PWM. FIG. 9 illustrates waveforms of signals at parts of the PWM circuit of FIG. 3 when a negative input signal VI is applied to the PWM.

Referring to FIG. 7, the integral signal VX has a triangular waveform oscillating between the first reference voltage aV and the second reference voltage −aV with an AC ground as the center. The integral signal VX increases from the second reference voltage −aV up to the first reference voltage aV. When the integral signal VX reaches the voltage level of the first reference voltage aV, the first comparator output signal COMO1 in the logic LOW state is generated (pulsed) and the integral signal VX begins to decrease. In turn, the integral signal VX decreases from the first reference voltage aV down to the second reference voltage −aV. When the integral signal VX reaches the voltage level of the second reference voltage −aV, the second comparator output signal COMO2 in the logic LOW state is generated (pulsed) and the integral signal begins to decrease again.

When the input signal is not applied to the PWM circuit 1000, a rising time and a falling time of the integral signal VX are equal as shown in FIG. 7. Therefore, the duty factor (or duty ratio) of the PWM signal V0 is ½.

Referring to FIG. 8, when a positive (+) input signal VI is applied to the PWM circuit 1000 (at integrator 110 of FIG. 4), the rising time and falling time of the integral signal VX become different from each other: The falling time of the integral signal VX decreases and the rising time increases. In other words, the LOW level duration time (of PWM signal V0) is greater than the HIGH level duration time (of PWM signal V0), and thus, the duty factor of the PWM signal V0 is smaller than ½.

When a positive (+) input signal VI is applied to the PWM circuit 1000 (at integrator 110 of FIG. 4), the input current Ii with a magnitude of VI/R1 is generated. This input current Ii decreases the falling time of the integral signal VX and increases the rising time of the integral signal VX.

Referring to FIG. 9, when a negative (−) input signal VI is applied to the PWM circuit 1000 (at integrator 110 of FIG. 4), the rising time and falling time of the integral signal VX become different from each other: The falling time of the integral signal VX increases and the rising time decreases. In other words, the HIGH level duration time (of PWM signal V0) is greater than the low level duration time (of PWM signal V0), and thus, the duty factor of the PWM signal is greater than ½.

When a negative (−) integral signal VI is applied to the integrator 110 of FIG. 4, the input current Ii having a magnitude of VI/R1 is generated. The input current Ii increases the falling time of the integral signal VX and decreases the rising time of the integral signal VX.

The operation of the PWM circuit of FIG. 3 will now be described in further detail with reference to FIG. 3 through FIG. 9.

The first reference voltage REFT may be a top threshold voltage (determining a maximum voltage of the integral signal VX), and the second reference voltage REFB may be a bottom threshold voltage (determining a minimum voltage of the integral signal VX). As noted in FIG. 3, the first reference voltage REFT may be fixed to a positive value (+aV) proportional to the high source voltage V of the switching circuit 150, and the second reference voltage REFB may be fixed to a negative value (−aV) proportional to the low source voltage −V of the switching circuit 150.

In general, the relation between a voltage V, a current I and charge/discharge time T, to charge/discharge a charge amount may be represented as following Equation 1:

$$T=(CV)/I \qquad \text{[Equation 1]}$$

When the input signal VI is not applied, the rising time Tr (of a rising portion), the falling time Tf (of a falling portion) and a period Ts (the sum of the rising portion and the falling portion) of the integral signal VX may be calculated as follows.

When the PWM signal V0 has the same value as the high source voltage +V and the feedback resistor has the value Rf, the feedback current If is determined as If=V/Rf. In addition, a voltage range of the integral signal VX is aV−(−aV)=2aV.

When the input signal VI is not applied, the falling time Tf and the rising time Tr are equal to each other and may be represented as Equation 2.

$$Tf=Tr=2a \times Rf \times C1 \qquad \text{[Equation 2]}$$

When a positive (+) input signal VI is applied, the falling time Tf and the rising time Tr of the integral signal VX may be represented as in Equation 3 and 4, respectively.

$$Tf = \frac{C1 \cdot 2a \cdot V}{\frac{VI}{R1} + \frac{V}{Rf}} = \frac{R1 \cdot Rf \cdot C1}{Rf \cdot VI + R1 \cdot V} \cdot (2a \cdot V) \qquad \text{[Equation 3]}$$

$$Tr = \frac{C1 \cdot 2a \cdot V}{\frac{V}{Rf} - \frac{VI}{R1}} = \frac{R1 \cdot Rf \cdot C1}{R1 \cdot V - Rf \cdot VI} \cdot (2a \cdot V) \qquad \text{[Equation 4]}$$

When a positive (+) input signal VI is applied, the period Ts of the integral signal VX is represented as Equation 5.

$$Ts = Tf + Tr = \frac{R1 \cdot Rf \cdot C1}{Rf \cdot VI + R1 \cdot V} \cdot (2a \cdot V) + \frac{R1 \cdot Rf \cdot C1}{R1 \cdot V - Rf \cdot VI} \cdot (2a \cdot V) \quad \text{[Equation 5]}$$

Equation 5, if rearranged, leads to Equation 6.

$$Ts = Tf + Tr = 4a \cdot Rf \cdot C1 \cdot \frac{(R1 \cdot V)^2}{(R1 \cdot V)^2 - (Rf \cdot VI)^2} \quad \text{[Equation 6]}$$

Thus, when a positive (+) input signal VI is applied, the frequency fs is represented as Equation 7.

$$fs = \frac{1}{Ts} = \frac{1}{4a \cdot Rf \cdot C1} \cdot \left\{ 1 - \left( \frac{Rf \cdot VI}{R1 \cdot V} \right)^2 \right\} \quad \text{[Equation 7]}$$

Using Equations 3 and 4, the duty factor of the integral signal VX (and thus the duty factor of an output voltage of the PWM, signal V0) may be obtained and represented as Equation 8 when a positive (+) input signal is applied.

$$\text{Duty} = \frac{Tf}{Tf + Tr} = \frac{1}{2} \cdot \left( 1 - \frac{Rf \cdot VI}{R1 \cdot V} \right) \quad \text{[Equation 8]}$$

In the same manner as the above, when the negative (−) input signal VI is applied, the duty factor of the PWM signal V0 is obtained and represented as Equation 9.

$$\text{Duty} = \frac{Tf}{Tf + Tr} = \frac{1}{2} \cdot \left( 1 + \frac{Rf \cdot VI}{R1 \cdot V} \right) \quad \text{[Equation 9]}$$

Referring to Equations 8 and 9, it will be understood that the duty factor (duty cycle) of the PWM output signal V0 is linearly proportional to the input signal VI.

When the feedback current If has a positive (+) value, (when the PWM signal V0 is in the logic HIGH state), the integral signal VX which is an output voltage of the operational amplifier 112 increases linearly. The integral signal VX has a triangular waveform as shown in FIG. 7: As shown in FIG. 8, in the case of a positive (+) input signal VI, the absolute value of the slope of the integral signal VX increases for a falling portion of the integral signal VX, and the slope of the integral signal VX decreases for a rising portion of the integral signal VX. As shown in FIG. 9, in case of a negative (−) input signal VI, the absolute value of the slope of the integral signal VX decreases for a falling portion of the integral signal VX, and the slope of the integral signal VX increases for a rising portion of the integral signal VX.

Figure 10:
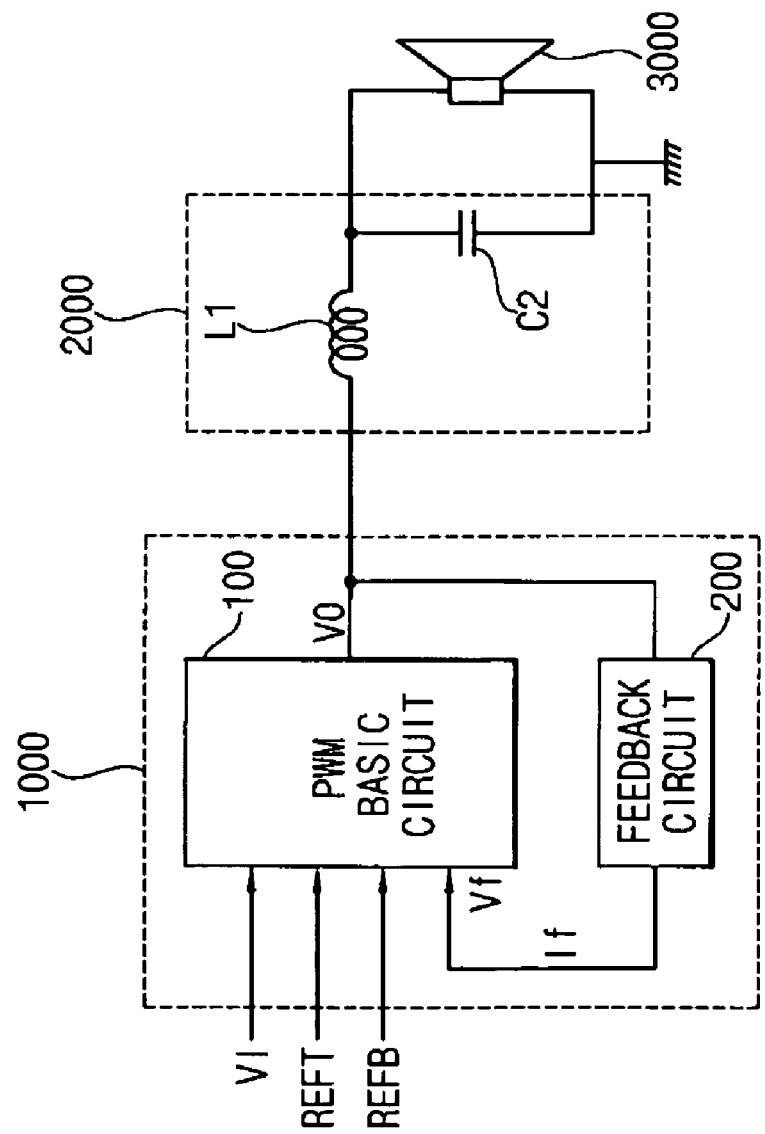
FIG. 10 is a block diagram illustrating a class-D audio amplifier including the PWM circuit of FIG. 3.

FIG. 10 is a block diagram illustrating a class-D audio amplifier including the PWM circuit of FIG. 3. Referring to FIG. 10, the class-D audio amplifier includes a PWM circuit 1000, a low-pass filter 2000 and a speaker 3000. The PWM circuit 1000 includes a PWM basic circuit 100 and a feedback circuit 200. The low-pass filter 2000 includes an inductor L1 and a capacitor C2.

The PWM circuit 1000 integrates an input current based on the input signal VI and the feedback current Ii that is a feedback of the PWM signal V0. The integrated signal is compared with the first reference voltage REFT and the second reference voltage REFB to generate the (internal) drive signals (see FIG. 3). Responding to the (internal) drive signals, the PWM circuit generates the PWM signal V0. The first reference voltage REFT may be a top threshold voltage (determining a maximum voltage of the integral signal VX, see FIG. 3), and the second reference voltage REFB may be a bottom threshold voltage (determining a minimum voltage of the integral signal VX, see FIG. 3). The PWM basic circuit 100 generates the PWM signal V0 in response to the feedback signal Vf, the input signal VI, the first reference voltage REFT and the second reference voltage REFB.

The feedback circuit 200 generates the feedback signal Vf in response to the PWM signal V0. The low-pass filter 2000 carries out low-pass filtering for the PWM signal V0. An audio signal, demodulated through the low-pass filter 2000, is provided to the speaker 3000.

The PWM circuit of the present invention may control the duty factor (duty cycle) of the PWM signal more elaborately, according to variations of the input signal, without the ramp signal generator. In addition, the PWM circuit without the ramp signal generator occupies a relatively smaller area in an integrated circuit, and the audio system including the PWM circuit may be implemented with a simpler hardware configuration. Furthermore, with varying the switching frequency according to the variation of the input signal, the PWM circuit of the present invention may reduce electromagnetic interference (EMI) due to the switching frequency.

It will be apparent to those skilled in the art that various modifications and variations can be made in the present invention. Thus, it is intended that the present invention cover the modifications and variations of this invention provided they come within the scope of the appended claims and their equivalents.

What is claimed is:

1. A pulse-width modulation (PWM) circuit comprising:
an integrator configured to integrate a feedback signal and an input signal and to thereby generate an integral signal;
a switching circuit configured to generate a PWM signal by switching an output node from a first source voltage to a second source voltage based upon comparing the integral signal with a first reference voltage and switching the output node from the second source voltage to the first source voltage based upon comparing the integral signal with a second reference voltage; and
a feedback circuit configured to generate the feedback signal based upon the PWM signal.

2. The PWM circuit of claim 1, further comprising:
a comparator unit configured to compare the integral signal with the first reference voltage and to compare the integral signal with the second reference voltage.

3. The PWM circuit of claim 2, wherein the comparator unit includes:
a first comparator configured to compare the integral signal with the first reference voltage and to output a pulse signal in a first logic state when the integral signal becomes greater than the first reference voltage; and
a second comparator configured to compare the integral signal with the second reference voltage and to output a pulse signal in the first logic state when the integral signal becomes smaller than the second reference voltage.

4. The PWM circuit of claim 2, further comprising:
a drive circuit configured to generate a first drive signal based upon the comparison of the integral signal with the first reference voltage and a second drive signal based upon the comparison of the integral signal with the second reference voltage; wherein the switching circuit generates the PWM signal by switching the output node between from the first source voltage and to the second source voltage based upon the first drive signal and by switching the output node between from the second source voltage and to the first source voltage based upon the second drive signal.

5. The PWM circuit of claim 1, further comprising:
a comparator unit configured to generate a first comparator output signal by comparing the integral signal with a first reference voltage and configured to generate a second comparator output signal by comparing the integral signal with a second reference voltage; and
a drive circuit configured to buffer the first comparator output signal and, the second comparator output signal to generate a first drive signal and a second drive signal; wherein the switching circuit generates the PWM signal by switching an output node between a first source voltage and a second source voltage in response to the first drive signal and the second drive signal.

6. The PWM circuit of claim 5, wherein the comparator unit further includes:
a latch circuit configured to latch the first comparator output signal and the second comparator output signal to generate a first latch output signal corresponding to the first comparator output signal and a second latch output signal corresponding to the second comparator output signal.

7. The PWM circuit of claim 6, wherein the latch circuit includes an RS latch circuit configured to latch the first comparator output signal and the second comparator output signal.

8. The PWM circuit of claim 6, wherein the drive circuit includes:
a first inverter configured to buffer the first latch output signal; and
a second inverter configured to buffer the second latch output signal.

9. The PWM circuit of claim 1, wherein the integrator includes:
a resistor having a first terminal configured to receive the input signal and a second terminal coupled to a first node;
an operational amplifier having a first input terminal, a second input terminal and an output terminal, wherein the first input terminal is coupled to the first node and receives the feedback signal, and wherein the second input terminal is grounded; and
a capacitor coupled between the first node and the output terminal of the operational amplifier.

10. The PWM circuit of claim 1, wherein the switching circuit includes:
a P-type switch configured to couple the output node with the first source voltage in response to the first drive signal; and
a N-type switch configured to couple the output node with the second source voltage in response to the second drive signal.

11. The PWM circuit of claim 1, wherein the feedback circuit includes a resistor.

12. The PWM circuit of claim 1, wherein the first reference voltage corresponds to a top threshold voltage for the integral signal, and the second reference voltage corresponds to a bottom threshold voltage for the integral signal.

13. The PWM circuit of claim 1, wherein an absolute value of the slope of the integral signal is increased for a falling portion of the integral signal and the slope of the integral signal is decreased for a rising portion of the integral signal based upon the input signal.

14. The PWM circuit of claim 1, wherein an absolute value of the slope of the integral signal is decreased for a falling portion of the integral signal and the slope of the integral signal is increased for a rising portion of the integral signal based upon the input signal.

15. The PWM circuit of claim 1, wherein the PWM signal has a duty factor varying linearly with a variation of the input signal.

16. The PWM circuit of claim 15, wherein the duty factor of the PWM signal corresponding to a falling portion of the integral signal is smaller than ½, and the duty factor of the PWM signal corresponding to a rising portion of the integral signal is greater than ½ when the input signal has a positive voltage.

17. The PWM circuit of claim 15, wherein the duty factor of the PWM signal corresponding to a falling portion of the integral signal is greater than ½, and the duty factor of the PWM signal corresponding to a rising portion of the integral signal is smaller than ½ when the input signal has a negative voltage.

18. A class-D audio amplifier comprising:
a pulse-width modulation (PWM) circuit configured to integrate an input signal and a feedback signal to generate a PWM signal, wherein the feedback signal is based upon the PWM signal,
wherein the pulse-width modulation (PWM) circuit includes:
an integrator configured to integrate the feedback signal and the input signal to generate an integral signal;
a comparator unit configured to generate a first comparator output signal by comparing the integral signal with a top threshold voltage, and configured to generate a second comparator output signal by comparing the integral signal with a bottom threshold voltage;
a latch circuit configured to latch the first comparator output signal and the second comparator output signal, and to generate a first latch output signal corresponding to the first comparator output signal and a second latch output signal corresponding to the second comparator output signal;
a drive circuit configured to buffer the first latch output signal and the second latch output signal to generate a first drive signal and a second drive signal; and
a switching circuit configured to generate the PWM signal in response to the first drive signal and the second drive signal, by switching an output node between a first source voltage and a second source voltage.

19. The class-D audio amplifier of claim 18 further configured to generate the PWM signal based upon comparing the integral signal with a top threshold voltage and with a bottom threshold voltage.

20. The class-D audio amplifier of claim 18, further comprising a feedback circuit configured to generate the feedback signal, wherein the feedback circuit includes a resistor.

21. The class-D audio amplifier of claim 18, further comprising a low-pass filter configured to carry out low-pass filtering for the PWM signal, wherein the low-pass filter includes:

an inductor having a first terminal coupled to an output node and a second terminal coupled to a speaker; and a capacitor coupled between the second terminal and a low source voltage.

22. A method of modulating a pulse-width, the method comprising:

generating an integral signal by integrating a feedback signal and an input signal;

generating a PWM signal by switching an output node from a first source voltage to a second source voltage based upon comparing the integral signal with a first reference voltage, and switching the output node from the second source voltage to the first source voltage based upon comparing the integral signal with a second reference voltage; and generating the feedback signal based upon to the PWM signal.

23. The method of claim 22, further comprising, generating a first comparator output signal by comparing the integral signal with the first reference voltage;

generating a second comparator output signal by comparing the integral signal with the second reference voltage;

generating a first drive signal and a second drive signal by buffering the first comparator output signal and the second comparator output signal.

24. The method of claim 22, further comprising, latching the first comparator output signal and the second comparator output signal to generate a first latched signal corresponding to the first comparator output signal and a second latched signal corresponding to the second comparator output signal, and generating the first drive signal and the second drive signal by buffering the first latched signal and the second latched signal.

25. The method of claim 22, wherein generating a first comparator output signal corresponds to outputting a first pulse in a first logic state when the integral signal becomes greater than the first reference voltage.

26. The method of claim 22, wherein generating a second comparator output signal includes outputting a second pulse in the first logic state when the integral signal becomes smaller than the second reference voltage.

27. The method of claim 22, wherein the first reference voltage corresponds to a top threshold voltage for the integral signal and the second reference voltage corresponds to a bottom threshold voltage for the integral signal.

28. The method of claim 22, wherein the absolute value of the slope of the integral signal is increased for a falling portion of the integral signal and the slope of the integral signal is decreased for a rising portion of the integral signal when the input signal has a positive voltage.

29. The method of claim 22, wherein the absolute value of the slope of the integral signal is decreased for a falling portion of the integral signal and the slope of the integral signal is increased for a rising portion of the integral signal when the input signal has a negative voltage.

30. The method of claim 22, wherein the PWM signal has a duty factor varying linearly with a variation of the input signal.

31. The method of claim 30, wherein the duty factor of the PWM signal corresponding to a falling portion of the integral signal is smaller than ½, and the duty factor of the PWM signal corresponding to a rising portion of the integral signal is greater than ½ when the input signal has a positive voltage.

32. The method of claim 30, wherein the duty factor of the PWM signal corresponding to a falling portion of the integral signal is greater than ½, and the duty factor of the PWM signal corresponding to a rising of the integral signal is smaller than ½ when the input signal has a negative voltage.

* * * * *